US011056338B2

(12) United States Patent
Gagnon

(10) Patent No.: US 11,056,338 B2
(45) Date of Patent: Jul. 6, 2021

(54) METHOD FOR PRINTING WIDE BANDGAP SEMICONDUCTOR MATERIALS

(71) Applicant: The Johns Hopkins University, Baltimore, MD (US)

(72) Inventor: Jarod C. Gagnon, Finksburg, MD (US)

(73) Assignee: The Johns Hopkins University, Baltimore, MD (US)

( * ) Notice: Subject to any disclaimer, the term of this patent is extended or adjusted under 35 U.S.C. 154(b) by 0 days.

(21) Appl. No.: 16/554,975

(22) Filed: Aug. 29, 2019

(65) Prior Publication Data

US 2020/0118816 A1    Apr. 16, 2020

Related U.S. Application Data

(60) Provisional application No. 62/866,674, filed on Jun. 26, 2019, provisional application No. 62/743,869, filed on Oct. 10, 2018.

(51) Int. Cl.
| | |
|---|---|
| *H01L 21/02* | (2006.01) |
| *H01L 29/40* | (2006.01) |
| *C30B 25/02* | (2006.01) |
| *C30B 29/40* | (2006.01) |
| *H01L 29/04* | (2006.01) |

(52) U.S. Cl.
CPC ........ *H01L 21/02538* (2013.01); *C30B 25/02* (2013.01); *C30B 29/406* (2013.01); *H01L 21/0242* (2013.01); *H01L 21/0262* (2013.01); *H01L 21/02387* (2013.01); *H01L 21/02455* (2013.01); *H01L 21/02488* (2013.01); *H01L 21/02576* (2013.01); *H01L 21/02579* (2013.01); *H01L 29/04* (2013.01)

(58) Field of Classification Search
None
See application file for complete search history.

(56) References Cited

U.S. PATENT DOCUMENTS

| | | | |
|---|---|---|---|
| 3,829,556 A | * | 8/1974 | Logan ................ C09K 11/7492 |
| | | | 423/409 |
| 4,636,401 A | | 1/1987 | Yamazaki et al. |
| 5,637,146 A | | 6/1997 | Chyi |
| 5,985,023 A | * | 11/1999 | Higuchi .............. H01L 33/0062 |
| | | | 117/54 |
| 6,566,231 B2 | | 5/2003 | Ogawa et al. |
| 6,632,725 B2 | | 10/2003 | Trassoudaine et al. |

(Continued)

FOREIGN PATENT DOCUMENTS

| | | |
|---|---|---|
| WO | 2008/067537 A2 | 6/2008 |
| WO | 2008/133653 A2 | 11/2008 |

OTHER PUBLICATIONS

US 9,623,396 B2, 04/2017, Kim et al. (withdrawn)

(Continued)

*Primary Examiner* — Asok K Sarkar
(74) *Attorney, Agent, or Firm* — Noah J. Hayward

(57) ABSTRACT

A method for printing a semiconductor material includes depositing a molten metal onto a substrate in an enclosed chamber to form a trace having a maximum height of 15 micrometers, a maximum width of 25 micrometers to 10 millimeters, and/or a thin film having a maximum height of 15 micrometers. The method further includes reacting the molten metal with a gas phase species in the enclosed chamber to form the semiconductor material.

20 Claims, 6 Drawing Sheets

(56) References Cited

U.S. PATENT DOCUMENTS

| | | | |
|---|---|---|---|
| 6,645,295 | B1 | 11/2003 | Koike et al. |
| 6,787,313 | B2 | 9/2004 | Morozov et al. |
| 6,848,458 | B1 | 2/2005 | Shrinivasan et al. |
| 6,852,161 | B2 | 2/2005 | Urashima et al. |
| 6,864,158 | B2 | 3/2005 | Ishida |
| 6,916,584 | B2 | 7/2005 | Sreenivasan et al. |
| 6,918,666 | B2 | 7/2005 | Sekiya |
| 7,087,523 | B2 | 8/2006 | Grigoropoulos et al. |
| 7,141,498 | B2 | 11/2006 | Malhan et al. |
| 7,192,849 | B2 | 3/2007 | Fareed et al. |
| 7,255,844 | B2* | 8/2007 | Ponce ............... C01B 21/0632 423/409 |
| 7,277,770 | B2 | 10/2007 | Huang |
| 7,297,625 | B2 | 11/2007 | Nakahata et al. |
| 7,618,704 | B2 | 11/2009 | Ittel et al. |
| 7,625,198 | B2 | 12/2009 | Lipson et al. |
| 7,633,097 | B2 | 12/2009 | Kim et al. |
| 8,111,350 | B2 | 2/2012 | Higashino et al. |
| 8,236,599 | B2 | 8/2012 | Chang et al. |
| 8,507,304 | B2 | 8/2013 | Kryliouk et al. |
| 9,978,589 | B2 | 5/2018 | Han et al. |
| 2005/0271560 | A1 | 12/2005 | Rodgers et al. |
| 2007/0175383 | A1 | 8/2007 | Fukuda et al. |
| 2010/0279020 | A1 | 11/2010 | Melnik et al. |
| 2011/0083607 | A1 | 4/2011 | You et al. |
| 2012/0328885 | A1 | 12/2012 | Chatterjee |
| 2015/0118626 | A1 | 4/2015 | Yoon et al. |
| 2016/0017515 | A1 | 1/2016 | Han |
| 2016/0243622 | A1 | 8/2016 | Henderson et al. |
| 2016/0247994 | A1 | 8/2016 | Amepalli et al. |
| 2017/0081199 | A1 | 3/2017 | Haag |
| 2017/0081780 | A1* | 3/2017 | Nagai ................ H01L 21/0242 |
| 2018/0226242 | A1 | 8/2018 | Kim et al. |
| 2019/0088816 | A1* | 3/2019 | Mori .................. H01L 33/0066 |

OTHER PUBLICATIONS

Elwell et al., "Crystal Growth of GaN by the Reaction Between Gallium and Ammonia.", Journal of Crystal Growth, 66 (1984), 45-54. (Year: 1984).*

Lee et al., "Characterization of Mg-Doped GaN Micro-Crystals Grown by Direct Reaction of Gallium and Ammonia", phys. stat. sol. (b) 228, No. 2, 371-373 (2001). (Year: 2001).*

S. Okada, et al., "Selective area growth of GaN on trench-patterned nonpolar bulk GaN substrates," Journal of Crystal Growth 468, 2017, pp. 851-855.

K. Fu, "Growth Dynamics of Semiconductor Nanostructures by MOCVD," Department of Theoretical Chemistry School of Biotechnology, Royal Institute of Technology, Stockholm, Sweden 2009, pp. 3-87.

C. Hemmingsson, et al., "Optimization of low temperature GaN buffer layers for halide vapor phase epitaxy growth of bulk GaN," http://dx.doi.org/10.1016/j.jcrysgro.2012.12.016, Journal of Crystal Growth (366), 2013, pp. 1-20.

C. Klemenz, et al., "Crystal growth and liquid-phase epitaxy of gallium nitride" J. Crys. Growth, 2000, 211, pp. 62-67.

B. Fu, et al., "The Effect of Growth Pressure and Growth Rate on the Properties of Mg-Dope GaN," J. Elec. Mat., 2014, vol. 43, No. 4, pp. 1244-1248.

R. Garcia, et al., "Measurement of the solubility of ammonia and nitrogen in gallium at atmospheric pressure," J. Alloys and Comp., 2009, 467, pp. 611-613.

United States, Electric Ships Office, PMS 320. "Naval Power Systems Technology Development Roadmap," Apr. 29, 2013, pp. 1-87.

I. Kizilyalli, et al., "Vertical Devices in Bulk GaN Drive Diode Performance to Near-Theoretical Limits," How2Power Today Newsletter, Mar. 2013.

T. Kachi, "Current status of GaN power devices," IEICE Elec. Exp., 2013, vol. 10, No. 21 pp. 1-12.

G. Meneghesso, et al., "Reliability and parasitic issues in GaN-based power HEMTs: a review," Semicond. Sci. and Tech., 2016, 31, 093004, pp. 1-10.

A.-P. Taylor et al., "Electrospray-printed nanostructured graphene oxide gas sensors," Nanotechnology 26, 2015, pp. 1-8.

S. H. Huang, et al., "Additive manufacturing and its societal impact: a literature review," The International Journal of Advanced Manufacturing Technology, 67, 2013, pp. 1191-1203.

T. D. Ngo, et al."Additive manufacturing (3D printing): A review of materials, methods, applications and challenges," Composites Part B: Engineering 143, 2018, pp. 172-196.

E. Fortunato, et al., "Oxide Semiconductor Thin-Film Transistors: A Review of Recent Advances," Advanced Materials, 24, 2012, pp. 2945-2986.

S. Morkoc, et al., "Large-band-gap SiC, III-V nitride, and II-VI ZnSe-based semiconductor device technologies," Journal of Applied Physics, 76, 1994, pp. 1363-1398.

T. P. Chow, et al., "Wide Bandgap Compound Semiconductors for Superior High-Voltage Unipolar Power Devices," IEEE Transactions on Electronic Devices, 41, 1994, pp. 1481-1483.

I. C. Kizilyalli, et al., "Vertical Power p-n Diodes Based on Bulk GaN," IEEE Transactions on Electronic Devices, 62, 2015, pp. 414-422.

N. Saengchairat, et al., "A review: Additive manufacturing for active electronic components," Virtual and Physical Prototyping, 12, 2017, pp. 31-46.

H. L. Wei, et al., "Evolution of solidification texture during additive manufacturing," Scientific Reports, 5, 2015, 16446, pp. 1-7.

J. Rodel et al., "Development of a roadmap for advanced ceramics: 2010-2025," Journal of the European Ceramic Society, 29, 2009, pp. 1549-1560.

M. Azizi, et al., "Liquid Phase Epitaxy (LPE) of GaN on c- and r-faces of AlN substrates," Journal of Crystal Growth, 322, 2011, pp. 74-77.

M. D. Dickey, "Emerging Applications of Liquid Metals Featuring Surface Oxides," ACS Applied Materials and Interface, 6, 2014, pp. 18369-18379.

C. Ladd, et al., "3D Printing of Free Standing Liquid Metal Microstructures," Advanced Materials, 25, 2013, pp. 5081-5085.

R. A. Logan, et al., "Heteroepitaxial Thermal Gradient Solution Growth of GaN," Journal of the Electrochemical Society: Solid-State Science and Technology, 119, 1972, pp. 1727-1735.

K. A. Klinedinst, et al., "Oxygen Diffusion in Liquid Gallium and Indium," Journal of the Electrochemical Society, 120, 1973, pp. 304-308.

Y. Liu, et al., "A predictive equation for solute diffusivity in liquid metals," Scripta Materialia, 55, 2006, pp. 367-370.

J. Unland, et al., "Thermodynamics and Phase Stability in the Ga—N System," Journal of Crystal Growth, 256, 2003, pp. 33-51.

O. Ambacher, "Growth and Applications of Group III-nitrides," Journal of Applied Physics D: Applied Physics, 31, 1998, pp. 2653-2710.

A. Tanaka, et al., "GaN crystal growth on an SiC substrate from Ga wetting solution reacting with NH3," Journal of Crystal Growth, 249, 2003, pp. 59-64.

M. Vaezi, et al., "A review on 3D micro-additive manufacturing technologies," Int J Adv Manuf Technol, 67, 2013, pp. 1721-1754.

S.C. Ligon, et al., "Polymers for 3D Printing and Customized Additive Manufacturing," Chem. Rev. 117, 2017, pp. 10212-10290.

M. L. Dantec, et al., "Additive Manufacturing of Semiconductor Silicon on Silicon Using Direct Laser Melting," Industrializing Additive Manufacturing—Proceedings of Additive Manufacturing in Products and Applications—AMPA2017, DOI 10.1007/978-3-319-66866-6_10, Sep. 6, 2017, pp. 104-116.

D. L. Bourell, et al., "A Brief History of Additive Manufacturing and the 2009 Roadmap for Additive Manufacturing: Looking Back and Looking Ahead," US—TURKEY Workshop on Rapid Technologies, Sep. 24, 2009, pp. 5-11.

D. L. Bourell, et al., "The Roadmap for Additive Manufacturing and its Impact," 3D Printing and Additive Manufacturing, 1, 1, 2014, pp. 6-9.

D. L. Bourell, et al., "Roadmap for Additive Manufacturing—Identifying the Future of Freeform Processing 2009," The Univer-

(56) References Cited

OTHER PUBLICATIONS sity of Texas at Austin Laboratory for Freeform Fabrication Advanced Manufacturing Center, 2009, pp. 1-92.

* cited by examiner

METHOD FOR PRINTING WIDE BANDGAP SEMICONDUCTOR MATERIALS

CROSS-REFERENCE TO RELATED APPLICATIONS

This application claims priority to and the benefit of prior-filed, U.S. Provisional Application Ser. Nos. 62/743,869 filed on Oct. 10, 2018, and 62/866,674 filed on Jun. 26, 2019, the contents of which are herein incorporated by reference in their entireties.

BACKGROUND

Wide bandgap semiconductor materials such as gallium nitride (GaN) semiconductors are very attractive for use in high-power, high-temperature, and/or radiation resistant electronics. One reason GaN semiconductors are so attractive is that they possess a band gap of a direct transition type of energy corresponding to the ultraviolet light region and can be combined with other group 13-nitride materials as ternary or quaternary compound semiconductors to expand the bandgap energy range to include the entirety of the visible light spectrum into the deep ultraviolet spectrum while permitting highly efficient light emission. One method of preparing GaN semiconductors is by growing relatively thick layers using hydride vapor phase epitaxy (HVPE). In this process, growth proceeds due to the high-temperature vapor-phase reaction between gallium mono-chloride (GaCl) and ammonia. The ammonia is supplied from a standard gas source, while the GaCl is produced by passing hydrogen chloride (HCl) gas over a liquid gallium supply. Using this method, GaN can be grown relatively quickly and inexpensively. Another method of producing GaN semiconductors is by metal-organic chemical vapor deposition (MOCVD). In this technique, ammonia gas ($NH_3$) is reacted with a metallo-organic compound containing gallium. The reaction occurs at high temperatures in the vicinity of a substrate, and GaN is deposited epitaxially on the substrate. This technique is disadvantageously both slow and expensive.

These techniques result in the formation of confluent GaN semiconductor layers on the substrate that require complicated pre-masking of the surface or etching steps to form localized areas of the GaN semiconductor in the substrate, which further decreases throughput and increases cost associated with fabricated devices. Accordingly, a need exists for a method of directly forming a localized GaN semiconductor on a substrate with a single process. Such a method would facilitate the development of high power, reliable GaN optoelectronic and electronic devices with reduced cost and higher throughput over existing means.

BRIEF SUMMARY

Disclosed herein is a method for printing a wide bandgap semiconductor material.

In an aspect (e.g., a non-limiting, example embodiment), a method for printing a semiconductor material includes depositing a molten metal onto a substrate in an enclosed chamber to form a trace having a maximum height of 15 micrometers, a maximum width of 25 micrometers to 10 millimeters, and/or a thin film having a maximum height of 15 micrometers. The method further includes reacting the molten metal with a gas phase species in the enclosed chamber to form the semiconductor material.

The above described and other features are exemplified by the following figures, detailed description, and claims.

BRIEF DESCRIPTION OF THE DRAWINGS

The figures are exemplary embodiments, wherein the like elements are numbered alike. Some of the figures are illustrative of the examples, which are not intended to limit devices made in accordance with the disclosure to the materials, conditions, or process parameters set forth herein. In the figures.

DETAILED DESCRIPTION

Figure 1:
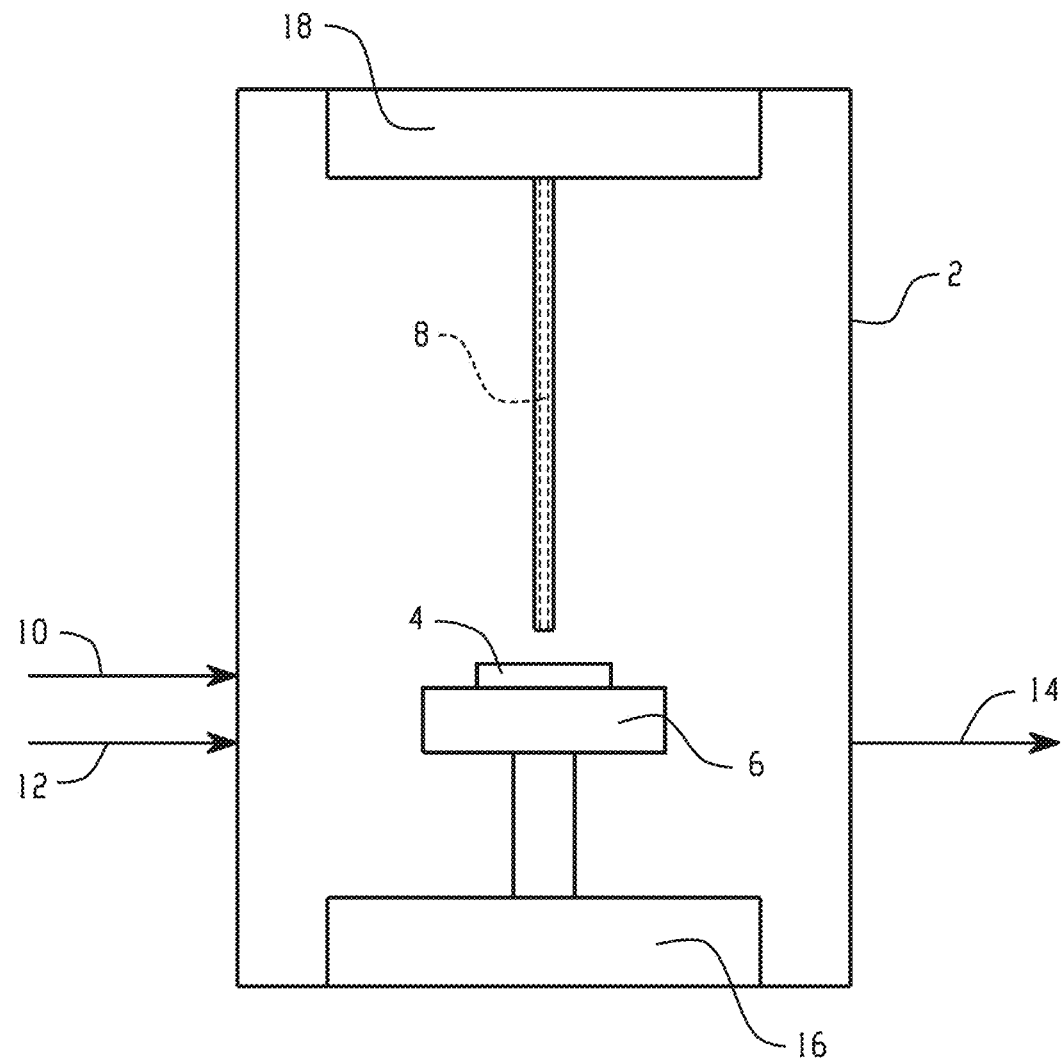
FIG. 1 is an illustration of an aspect (e.g., a non-limiting, example embodiment) of an enclosed chamber 2.

Current semiconductor device architectures are limited to what is achievable using standard semiconductor device fabrication methods, which are usually a combination of thin film deposition, etching, regrowth, and other processing steps to develop a final device. Process and material limitations on material quality, process speed, dimensional accuracy, and achievable geometries restrict the development of new device architectures. With the advent of additive manufacturing, many materials and applications have benefited from the ability to three dimensional (3D) print complex structures. Layer by layer printing processes allow rapid production of complex geometries enabling significant capability improvements across multiple domains. To date, however, the research of additively manufactured semiconductors has been minimal.

The lack of compound semiconductor additive manufacturing research stems in large part from the difficulty of adapting common additive manufacturing methods to electronic materials. Most semiconductor devices require a single-crystal material with low defect densities in order to maintain the electrical properties necessary for device operation. The presence of grain boundaries act as carrier scattering sites that can limit the capabilities of any fabricated devices. Typical additive manufacturing processes involve localized melting, severe plastic strain, consolidation of randomly oriented particles, or chemical crosslinking, all of which tend to generate polycrystalline structures. Being able to additively build semiconductor structures though could reduce the cost associated with more complex device structures that can only be formed through multiple etch and growth steps using current processes. This benefit is of particular interest for wide bandgap semiconductor materials such as GaN as GaN is a material widely used in optoelectronic, high-power, and high-frequency device applications due to its wide [3.4 electron Volt (eV)] direct bandgap.

A method for printing a semiconductor material, referred to herein as gas-phase reactive additive manufacturing (GRAM), was developed that comprises depositing a molten metal onto a substrate in an enclosed chamber; and reacting the molten metal with a gas phase species in the enclosed chamber to form the semiconductor material. In other words, the gas-phase reactive additive manufacturing method can comprise printing a molten semiconductor precursor onto a substrate and reacting the precursor with a gas phase reactant at elevated temperatures to form the semiconductor material. Such a reaction-based process can be preferred over using a semiconductor feedstock (such as GaN) to provide an improved synthesis route with lower temperatures, better compositional control, or improved epitaxial growth. It is noted that this method can produce any semiconductor material that can be formed by the reaction of a gas phase species and a molten metal. For example, the method can manufacture a silicon nitride layer, a silicon arsenide layer, a Group 13 metal phosphide or arsenide layer, a gallium arsenide layer, or the like.

The gas-phase reactive additive manufacturing method has several additional benefits over methods such as hydride vapor phase epitaxy or metal-organic chemical vapor deposition. For example, the present method can impart controlled, localized printing of the molten metal, which can result in the formation of complex vertical device architectures and a lower dislocation density material. The present method can allow for the bottom-up printing of semiconductor materials that can eliminate various etching and regrowth steps that can be extremely time intensive. The present method can exhibit higher crystallization rates as compared to liquid phase epitaxy due to a lesser diffusion length needed for the gas phase species to travel through the molten metal and react at the substrate surface to form an epitaxial film. The present method can result in the formation of a single crystal semiconductor, which is not easily obtainable.

FIG. 1 is an illustration of an example of an enclosed chamber 2. FIG. 1 illustrates that a gas phase species stream 10 comprising a gas phase species can allow the gas phase species to flow into the enclosed chamber 2. Likewise, an inert gas stream 12 comprising an inert gas can allow the inert gas to flow into the enclosed chamber 2. It is noted that while the gas phase species stream 10 and the inert gas stream 12 are illustrated as different streams, they could conversely be introduced as a single stream. A purge gas stream 14 can be present to allow for gas to be removed from the enclosed chamber 2 through an outlet or vacuum line.

A substrate 4 can be located on a stage 6 that can optionally be a heated stage 6. The stage 6 can have 1 or more directions of control, or 1 to 6 directions of control, or 1 to 3 directions of control. For example, the stage 6 can have at least 1 direction of control allowing it to move in the z-direction such that it can raise and lower the stage 6 towards an injection orifice 8 via a motor control unit 16. The injection orifice 8 can have 1 or more directions of control, or 1 to 6 directions of control, or 1 to 3 directions of control. For example, the injection orifice 8 can have at least 2 directions of control in the x- and y-directions via a translation control unit 18. The injection orifice 8 can be any of a number of existing deposition mechanisms that can allow for the controlled deposition (for example, controlling at least one of the volume deposited or the deposition rate) of the molten metal. For example, the injection orifice 8 can comprise an opening to deposit a trace (for example, a line, a spot, or the like) of the molten metal on the substrate 4. Conversely, the method of depositing the molten metal 13 can comprise depositing a thin film of the molten metal. The depositing of the thin film is not limited and can be performed, for example, by flow coating, spray coating, or the like.

Figure 2:
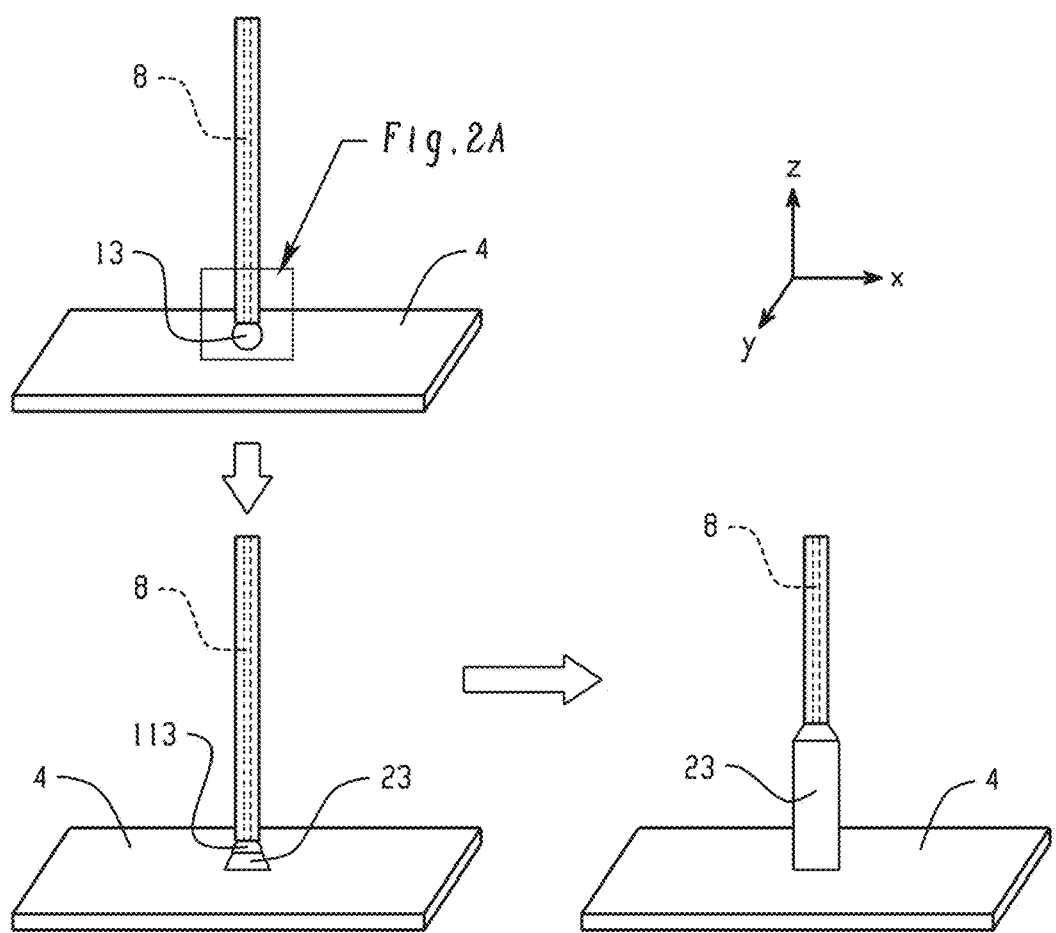
FIG. 2 is an illustration of an aspect of depositing a molten metal 13 on a substrate 4.

FIG. 2 is an illustration of an aspect (e.g., a non-limiting, example embodiment) of the method of forming the semiconductor material 23 in the enclosed chamber 2. The top image in FIG. 2 shows that an amount of a molten metal 13 can be deposited onto the substrate 4 via the injection orifice 8. During the depositing, at least one of the injection orifice 8 or the substrate 4 can be translated in at least an x-y plane to form a trace of the molten metal 13 on the substrate 4. The trace can have a maximum height of 15 micrometers, or 1 to 12 micrometers. The trace can have a maximum width of 25 micrometers to 10 millimeters, or 100 micrometers to 2 millimeters. The trace can be in the form of at least one of a line, a spot, or the like. If the molten metal 13 is deposited to form a thin film, then the thin film can have a maximum height of 15 micrometers, or 1 to 12 micrometers.

Figure 2A:
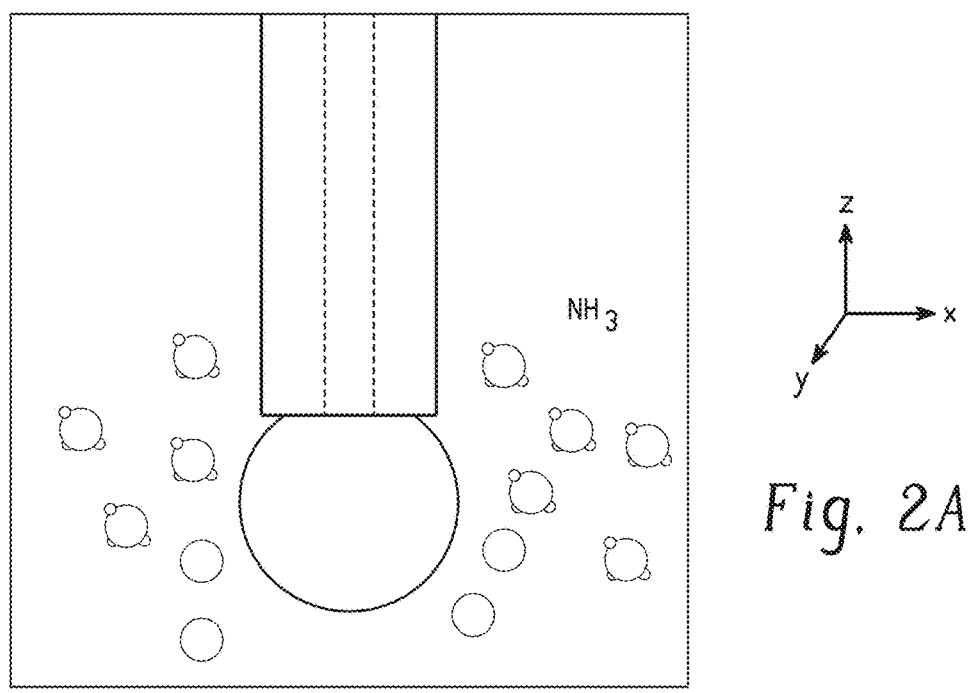
FIG. 2A is an enlarged portion of FIG. 2, where the enlargement is of the area designated in FIG. 2 as "FIG. 2A;"

FIG. 2A illustrates that the enclosed chamber 2 can include gas phase nitrogen (illustrated as $NH_3$) from the gas phase species stream 10 during the depositing. In this scenario, the gas phase nitrogen can start to diffuse into the molten metal 13. The bottom left image in FIG. 2 illustrates that the reaction between the gas phase nitrogen and the molten metal 13 can proceed to form a semiconductor material 23 on the substrate 4.

The bottom images of FIG. 2 illustrate that the method for printing the semiconductor material 23 can comprise depositing a second molten metal 113 onto the semiconductor material 23 (bottom right image) and allowing the second molten metal 13 to react with the gas phase species in the enclosed chamber 2 to form the semiconductor material 23 having an increased height in the z-direction (bottom right image). This additive method of forming 3D semiconductor material 23 with increased, and optionally with varying heights in different locations along the trace or thin film, can result in a significant increase in the design flexibility.

The substrate 4 can be an atomically symmetric substrate 4. The substrate 4 can be any substrate suitable for growth of an epitaxial layer, for example, aluminum gallium nitride, aluminum nitride, aluminum indium gallium nitride, aluminum oxide (for example, sapphire), gallium arsenide, gallium indium nitride, gallium nitride, lithium aluminate, lithium gallate, magnesium oxide, silicon, silicon carbide, zinc oxide, diamond, quartz, or spinel. The substrate 4 can be a sapphire substrate or a silicon substrate. The substrate 4 can be a composite substrate. For example, a composite substrate can also be formed by providing a mono-crystalline silicon substrate and then growing one or more buffer layers of different crystalline films having intermediate lattice constants to crystalline film that is ultimately desired, such as for example a sapphire ($Al_2O_3$) crystalline film. The composite substrate can comprise a buffer layer, for example, at least one of a gallium nitride layer deposited by conventional methods, a ZnO layer, an $LiAlO_2$ layer, or an SiC layer. The substrate 4 can be patterned, for example, having raised portions.

The molten metal 13 can comprise at least one of a molten, Group 13 metal 13 and/or a molten silicon. The molten, Group 13 metal 13 can comprise at least one of gallium, aluminum, or indium. The molten, Group 13 metal 13 can consist essentially of gallium, or can consist of only gallium. The molten, Group 13 metal 13 can comprise aluminum and gallium, or consist essentially of aluminum and gallium or can consist of aluminum and gallium alone, and can result in a semiconductor material 23 as a ternary compound, such as AlGaN with an even wider bandgap tailored to specific applications, making it an important base material for high-power devices.

The gas phase species stream 10 can be introduced at any time before, during, or after depositing the molten metal 13 on the substrate 4. The inert gas stream 12 and the gas phase species stream 10 can be introduced at the same or at different times. For example, the substrate 4 can be placed in a chamber and the chamber can be sealed to result in the enclosed chamber 2. The inert gas stream 12 can then be introduced to the enclosed chamber 2 and the molten metal 13 can be deposited in an inert environment on the substrate 4. During the depositing or after the molten metal 13 is deposited, the gas phase species stream 10 can be introduced to the enclosed chamber 2.

The gas phase species stream 10 comprises a reactive gas species that is capable of diffusing into the molten metal 13 and reacting therewith to form the semiconductor material 23. The gas phase species stream 10 can comprise at least one of a gas phase nitrogen species or a gas phase arsenic species. The gas phase nitrogen species can comprise at least one of ammonia ($NH_3$), hydrazine ($N_2H_4$), diimide ($N_2H_2$), or hydrazoic acid ($HN_3$). The gas phase nitrogen species can comprise $NH_3$. The enclosed chamber 2 can further comprise an inert gas, for example, introduced in inert gas stream 12. The inert gas can comprise at least one of hydrogen, argon, helium, or nitrogen. A volume ratio of the inert gas to the gas phase species can be 1.25 to 50, or 10 to 40. In order to reduce the formation of an oxide, the enclosed chamber 2 can comprise less than or equal to 1,000 parts per million (ppm), or 0 to 100 ppm by volume of oxygen.

During the depositing, a temperature of the molten metal 13 can be greater than or equal to 30 degrees Celsius (° C.), or 30 to 50° C. After the molten metal 13 is deposited, a temperature in the enclosed chamber 2 can be increased to a reaction temperature. The reaction temperature can be greater than or equal to 600° C., or 1,000 to 1,500° C., or 1,000 to 1,200° C. A pressure in the enclosed chamber 2 can be greater than or equal to 60 Torr, or 60 to 760 Torr.

The gas phase species reacts with the molten metal 13 at the reaction temperature to form the semiconductor material 23. A crystallization rate of the molten metal 13 to form the semiconductor material 23 can be 0.035 to 3 micrometers per minute, or 0.035 to 0.3 micrometers per minute. The semiconductor material 23 can be a single crystal.

A p-type or n-type semiconductor material can be formed using the gas-phase reactive additive manufacturing method. The p-type semiconductor material can comprise a p-type dopant, for example, at least one of Mg, Be, Ca, Sr, or a Group 1 or 2 element having 1 or 2 valence electrons. The n-type semiconductor material can comprise an n-type dopant, for example, at least one of a Group 14 (for example, Si, Ge, Sn, or Pb), Group 15, or Group 16 element of the Periodic Table. The respective doped semiconductor materials can be formed by at least one of adding a dopant to the molten metal 13 and printing the doped metal or introducing a gas phase dopant to the enclosed chamber 2 or a combination of introducing the dopant to the molten metal 13 and introducing the gas phase dopant to the enclosed chamber 2. The gas phase dopant (for example, dicyclopentadienyl magnesium) can permeate the molten metal 13 to result in a p-type or n-type semiconductor material.

Using the gas-phase reactive additive manufacturing method, a multilayer semiconductor material 23 can be formed. For example, a p-type semiconductor layer can be formed, an undoped semiconductor layer can be formed on the p-type semiconductor layer, and an n-type semiconductor layer can be formed on the undoped semiconductor layer.

An article can comprise the semiconductor material 23 formed by the present method. For example, the article can be a light emitting diode, a laser diode, or a transistor.

In an aspect, a method for printing a semiconductor material includes depositing a molten metal comprising a Group 13 metal or silicon, preferably at least one of gallium, aluminum, or indium, onto a substrate in an enclosed chamber to form a trace having at least one of a maximum height of 15 micrometers (preferably a maximum height of 1 to 12 micrometers), or a maximum width of 25 micrometers to 10 millimeters (preferably a maximum width of 100 micrometers to 2 millimeters), or a thin film having a maximum height of 15 micrometers a maximum height of 1 to 12 micrometers; reacting the molten metal, preferably at a temperature greater than or equal to 600° C., with a gas phase nitrogen- or arsenic-containing species, preferably at least one of ammonia, hydrazine, diimide, or hydrazoic acid, in the enclosed chamber to form the semiconductor material; and translating at least one of an injection orifice in the enclosed chamber or the substrate in an x-y plane during the depositing to form the trace of the molten metal on the substrate.

In this aspect, the enclosed chamber can further have an inert gas present, wherein a volume ratio of the inert gas to the gas phase species is 1.25 to 50. The gas phase species can be added to the enclosed chamber after the depositing. The molten metal can have a crystallization rate to form the semiconductor material of 0.035 to 3 micrometers per minute. Particularly advantageous results can be obtained in these aspects where the substrate is an atomically symmetric substrate, preferably a sapphire substrate.

Still further in these aspects, the semiconductor material can be a single crystal, and the molten metal can comprise a p-type dopant or an n-type dopant. Preferably, the p-type dopant or the n-type dopant can be present in the enclosed chamber as a gas phase that permeates the molten metal.

In a yet further feature of these aspects, the method can include depositing a second molten metal onto the semiconductor material and allowing the second molten metal to react with the gas phase species in the enclosed chamber to form the semiconductor material having an increased height, preferably wherein the at least one of the molten metal or the second molten metal comprises a dopant.

The following examples are provided to illustrate the present disclosure. The examples are merely illustrative and are not intended to limit devices made in accordance with the disclosure to the materials, conditions, or process parameters set forth therein.

EXAMPLES

Example 1

Determination of the Crystal Phase Growth Rate

Computational modeling was used to estimate growth velocities in a decreased melt volume to illustrate the change in the overall crystallization rate that arises from the decreased diffusion length of the gas phase species into the molten metal. Specifically, a one-dimensional diffusion model for $NH_3$ in molten Ga was used, presuming a concentration of $NH_3$ at the Ga surface at the solubility limit, $c_{max}$, and total conversion to GaN at the solidification interface, so that the flux of N species consumed by GaN growth was equal to the diffusive flux. The growth rate was thus predicted to increase transiently as the Ga melt was consumed, and the resulting average growth rate, $\bar{v}$, was $$\bar{v} = g(1 + M_N/M_{Ga})\rho_{Gd}/\rho_{GaN} D c_{max}/L_0$$

where $M_i$ and $\rho_i$ are the molar mass and density of the respective materials i, and D and $c_{max}$ are the diffusivity and solubility of $NH_3$ in molten Ga. Although the model is one-dimensional, the factor g accounts for the geometry of the Ga melt based on the average distance that $NH_3$ diffuses before conversion. Representative values of g are 1, 1.6, and 2 for uniform thickness, half-cylinder, and half-sphere melt geometries, respectively.

Figure 3:
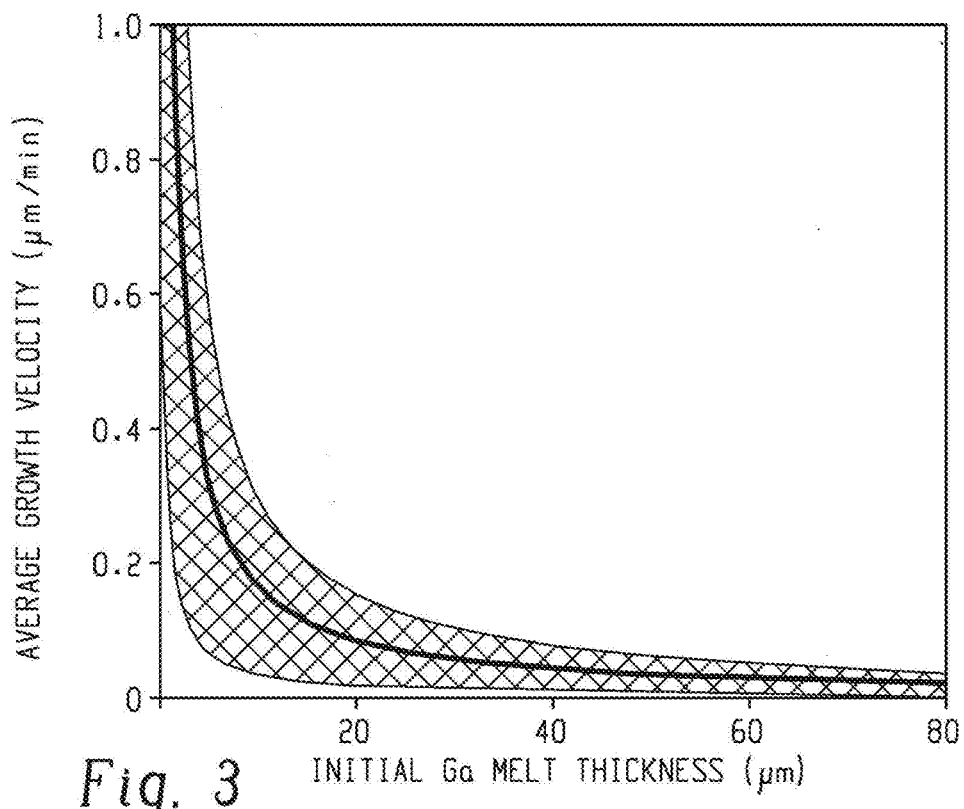
FIG. 3 is a graphical illustration of the average growth velocity with initial melt thickness of Example 1.

A half-sphere melt geometry was used to estimate a droplet of gallium deposited onto a surface. At 1,000° C., the diffusivity was estimated as $1.3 \times 10^{-4}$ centimeters squared per second ($cm^2$ $s^{-1}$) and the solubility was estimated as $(1.0 \pm 0.8) \times 10^{-6}$ atomic percent, which imparts some uncertainty. The resulting velocities as a function of initial height of a half-spherical droplet are shown in FIG. 3. Considering these growth velocity estimations, including the uncertainty in the solubility estimation as shown in FIG. 3, a 10 micrometer printed gallium layer is expected to result in crystal growth rates of 0.035 to 0.30 micrometers per minute, values which are in the range of reported values for GaN films grown by metalorganic chemical vapor deposition (MOCVD). Based on these results, initial experiments were performed to support these calculations and demonstrate improved crystallization rates at reduced melt volumes in order to show the viability of the liquid-gas reaction process for a 3D printed semiconductor system.

It is noted that these calculations can be performed by additional geometries, to show that reducing the critical dimensions lowers the diffusion length and thereby increases the crystal growth rate. Half-sphere geometries are only used for example.

Example 2

Formation of GaN Traces on a Substrate Via Chemical Vapor Deposition

A set of experiments was performed to test the increased crystallization rate as compared to the rate proposed in the above model of Example 1. To isolate the effect of thickness from various printing parameters, gallium test patterns were deposited onto a c-plane sapphire substrate 4 using thermal evaporation in conjunction with a shadow mask to create a pattern of circles and bars with varying dimensions. Using the shadow mask, gallium patterns of various thicknesses were deposited in order to test the effect of thickness on crystallization time. After gallium deposition, the patterns were placed in an enclosed chamber 2 with a $N_2/NH_3$ gas mixture flowing over the sample as the enclosed chamber 2 was heated to a reaction temperature of 1,050° C. The samples were then held at temperature for various lengths of time to induce crystallization of GaN within the pattern. $N_2$:$NH_3$ ratios from 1.25 to 50 were used by varying the rate of $NH_3$ flow while holding the $N_2$ flow constant. A visible transition of opaque gallium metal to transparent GaN was observed at high temperatures and was used as a rough metric of timescale for initial crystallizations to ensure complete visual conversion before cooling the samples. Ex situ optical microscopy and x-ray diffraction (XRD) were performed to study the change in morphology and degree of crystallization. Results from samples with varying thicknesses of deposited gallium are shown in FIG. 4, where the asterisk denotes an abraded sample.

It is noted that the 65 micrometer sample was submitted to a $N_2$:$NH_3$ ratio of 1.25 in order to increase the rate of crystallization in the final sample as much as possible and was held at temperature for 30 minutes, at which time the pattern visibly stopped transitioning from opaque to transparent. All other samples shown in FIG. 4 were held at temperature for only 5 minutes with $N_2$:$NH_3$ of 25 and observed a similar visible transition, despite the shorter time and lower $NH_3$ flow.

Figure 4:
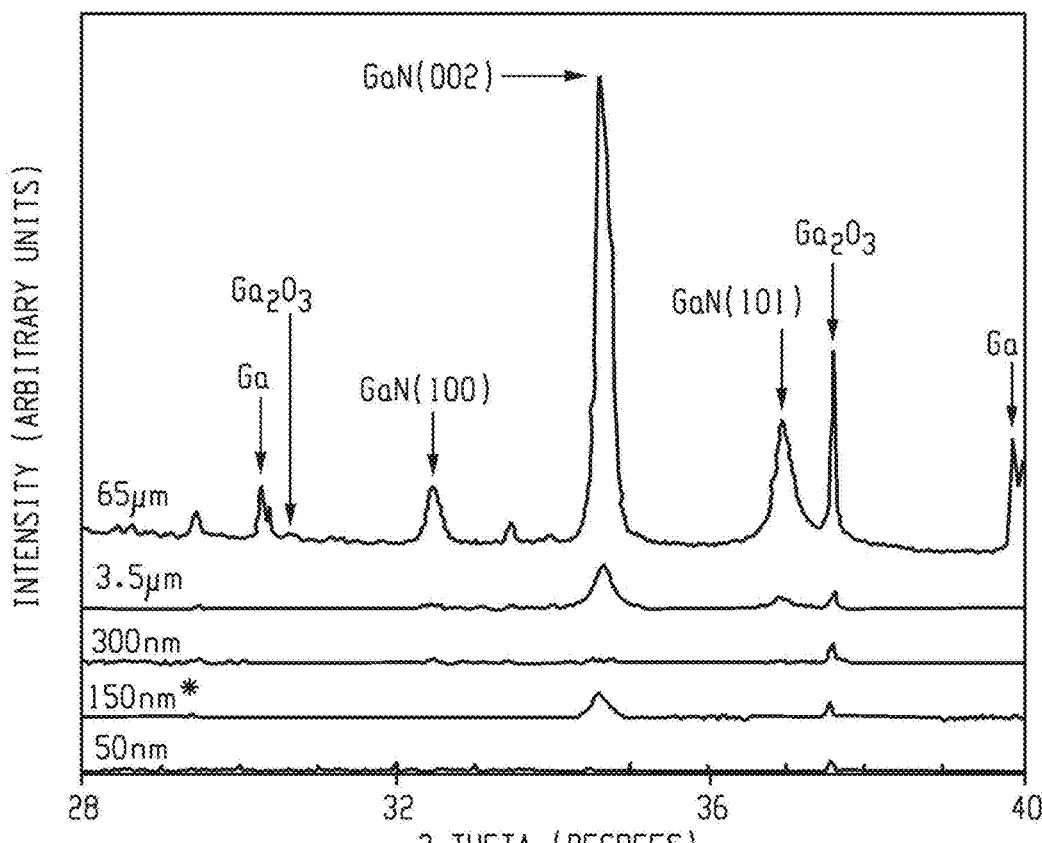
FIG. 4 is a graphical illustration of the x-ray diffraction (XRD) spectrum of Example 2.

FIG. 4 shows that some GaN formation was observed in the 65 micrometer sample, but the gallium metal peaks remained prominent in the XRD spectrum shown in FIG. 4 despite the longer time at temperature. These results are in line with the modeling results in FIG. 3, which suggested a crystallization time in excess of 2 hours would result in a full conversion at this thickness. As deposition thickness was decreased to 3.5 micrometers, the gallium peaks were significantly reduced, with only a slight peak visible at 39.6 degrees (°) despite the lower crystallization time and $NH_3$ flow. As thickness was decreased further, below 300 nanometers, no presence of GaN or significant gallium was observed in XRD, but a $Ga_2O_3$ peak remained. It is noted that the slight gallium peak at 39.6° remained in thinner samples, even at crystallization times up to 30 minutes. Without being bound by theory, it is believed that this peak arises from residual gallium trapped in between polycrystalline GaN grains, preventing $NH_3$ diffusion and halting full conversion of the structure.

FIG. 4 further shows the presence of an oxide peak at all thicknesses, where the GaN was observed to form a native oxide, based on the $Ga_2O_3$ peak. It is likely that an oxide formed on the evaporated gallium patterns due to the time the sample was exposed to air while it was transferred from the thermal evaporation chamber to the $NH_3$ annealing furnace. These results show the advantage of an aspect of the present method, where the depositing of the gallium and the crystallization can occur in the same enclosed chamber 2, reducing or eliminating the potential exposure to oxygen.

Example 3

Formation of GaN Traces on a Substrate Via Gas-Phase Reactive Additive Manufacturing Molten gallium was extruded through a motor-controlled quartz needle onto a heated substrate 4 in an oxygen-free environment as is illustrated in FIG. 1. A mixture of $N_2$ and $NH_3$ was flowed into the enclosed chamber 2 after printing the molten gallium onto the substrate 4 in order to convert gallium to GaN at elevated temperatures. Similar to the studies on thermally evaporated gallium of Example 2, initial GaN conversions were performed while flowing $NH_3$ and $N_2$ during the heating process to saturate the printed gallium before conversion. The XYZ motor used to control the print head did not have Z resolution capabilities below 50 micrometers so the layer was suspected to be on the same order of magnitude thickness as the 65 micrometers sample of Example 2. It is also noted that the annealing systems were built to different specifications, which benefited from different optimized crystallization conditions. Therefore, for the sake of brevity, specifics of gas flow rates and the optimization process are not reported on here and it is acknowledged that this is a best effort comparison based on relative process optimization.

Figure 5:
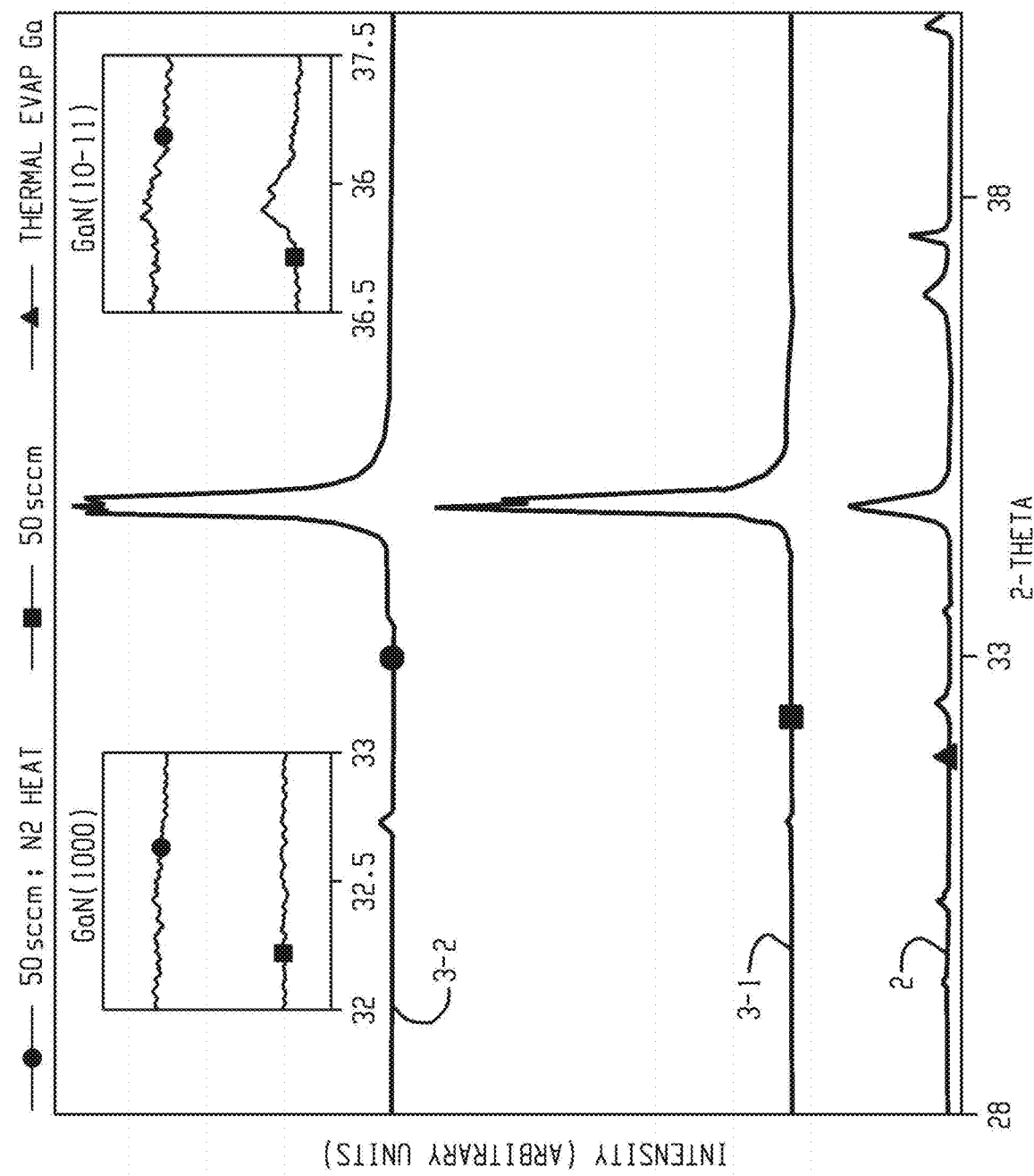
FIG. 5 is a graphical illustration of the XRD spectrum of Example 3.
Figure 8:
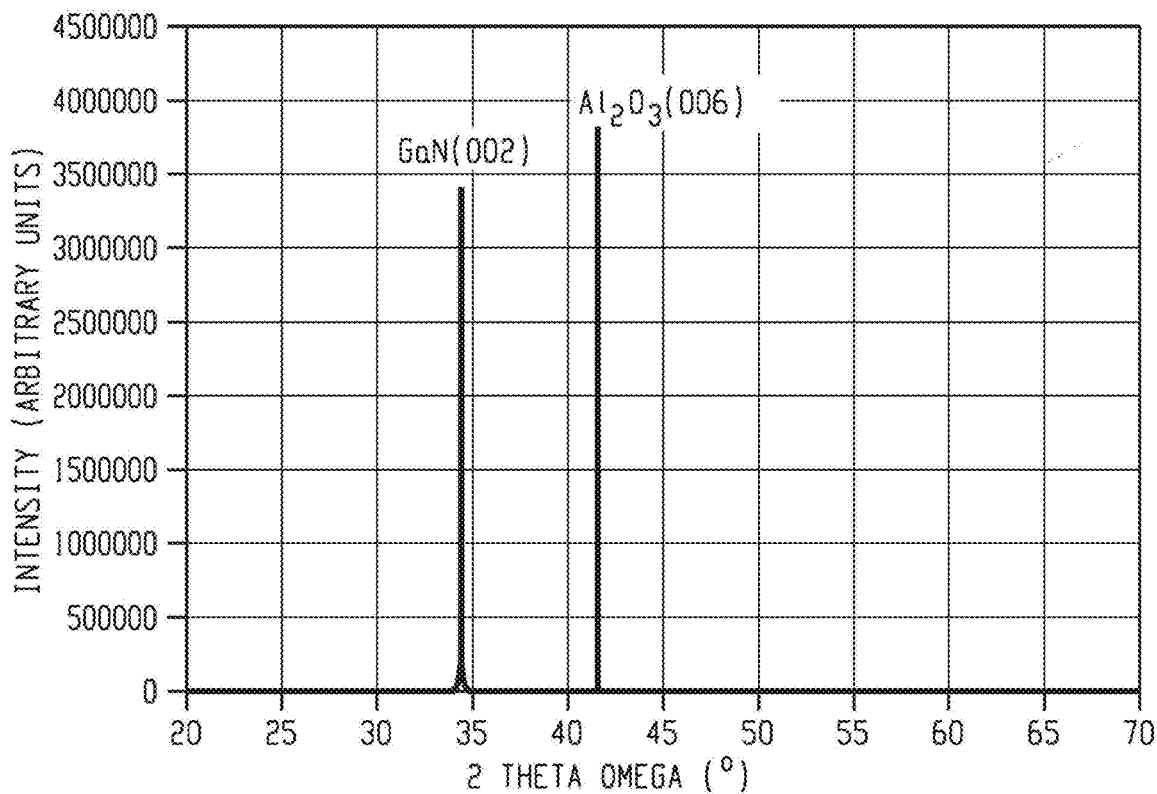
FIG. 8 is a graphical illustration of the XRD spectrum showing single crystal nature of material in Example 3.
Figure 9:
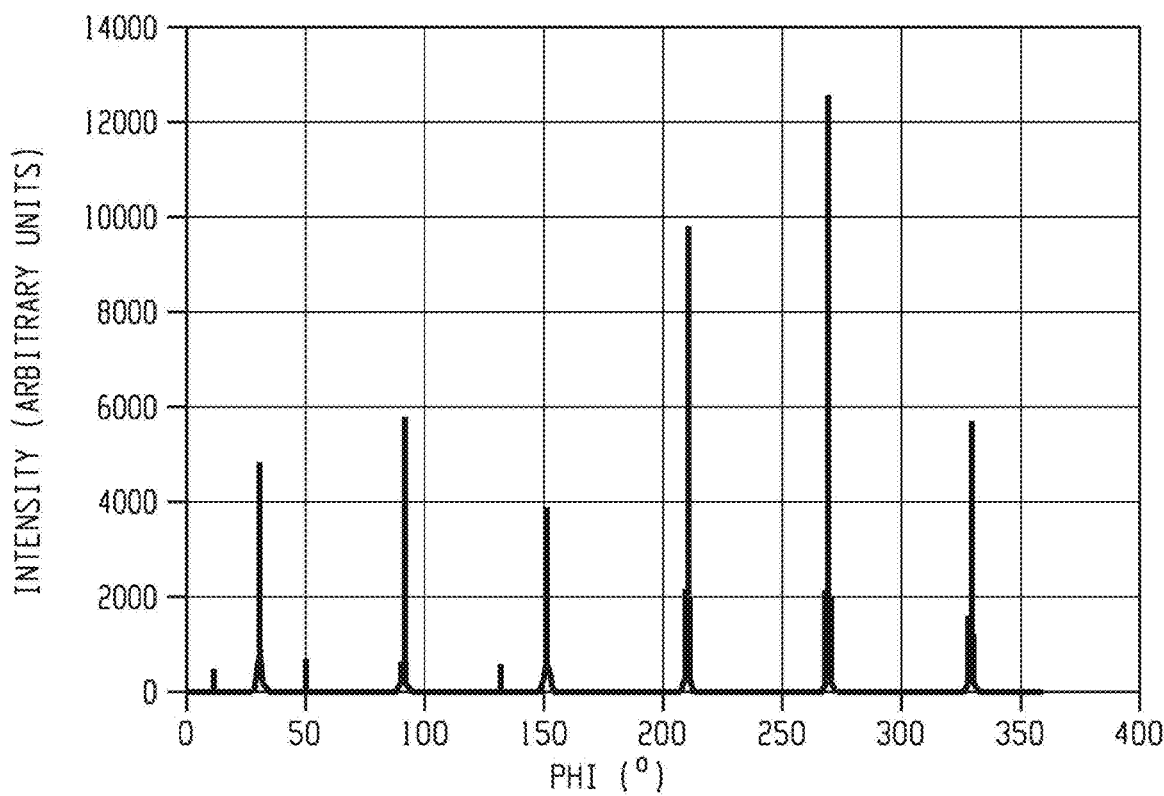
FIG. 9 is a graphical illustration of the XRD spectrum showing single crystal nature of material in Example 3.

The XRD spectra showing the degree of crystallinity at the 65 micrometers thermally evaporated gallium and the in situ printed gallium is shown in FIG. 5, where the flow rate of the nitrogen was 50 standard cubic centimeters per minute (sccm) for the samples 3-1 and 3-2, where the top trace, 3-2, was heated in an inert $N_2$ ambient prior to introduction of the reacting $NH_3$ gas into the enclosed chamber 2. A mixture of inert $N_2$ and reacting $NH_3$ gas was submitted to the sample indicated by the middle trace, 3-1, prior to and during heating. It is noted that the gallium line printed directly into a controlled ambient was only held at the crystallization temperature of 1,000° C. for 5 minutes as compared to the 30 minutes for the thermally evaporated GaN of Example 2, despite the similar projected thicknesses. Surprisingly, despite the shorter crystallization time, a significant improvement in the crystallinity was observed in the printed GaN as compared to that of Example 2, the trace of which is shown in FIG. 5 for ease of comparison. Moreover, FIG. 5 shows that no remaining gallium or $Ga_2O_3$ peaks were observed in the spectra of the crystallized GaN material of Example 3, indicating that the controlled $N_2$ ambient was capable of preventing oxidation, resulting in faster, more complete crystal conversion. Additionally, Example 3 resulted in a single-crystal nature in XRD post-conversion with a strong GaN(0002) peak and only a very slight peak observable above the noise at the peak position for (10-11) GaN. This single-crystal nature is shown in FIG. 8 and FIG. 9. FIG. 8 shows a 2 theta-omega scan showing a single GaN peak in high resolution XRD and FIG. 9 shows a phi scan displaying 6 evenly spaced primary peaks indicating that there is a single rotational alignment to provide evidence that single crystal material was obtained.

Without intending to be bound by theory, the faster crystallization of printed gallium may have been partially due to the removal of the oxide layer that acted as an $NH_3$ diffusion barrier in Example 2. All crystallizations reported up to this point were performed with heating occurring in a $N_2/NH_3$ ambient in order to saturate the gallium droplet and increase the crystallization rate.

Based on the faster observed crystallization rate of printed gallium, an additional test, 3-1, was performed with heating in a $N_2$ ambient to try to prevent crystallization below 1,000° C. to thereby improve the crystal quality of the converted GaN. No significant change in conversion rate was observed when heating in a pure $N_2$ ambient (total time at temperature was still 5 minutes), but the crystal orientation was improved slightly as shown by the decrease in the slight decrease in the GaN(10-11) XRD peak as shown the inset of FIG. 5.

Figure 6:
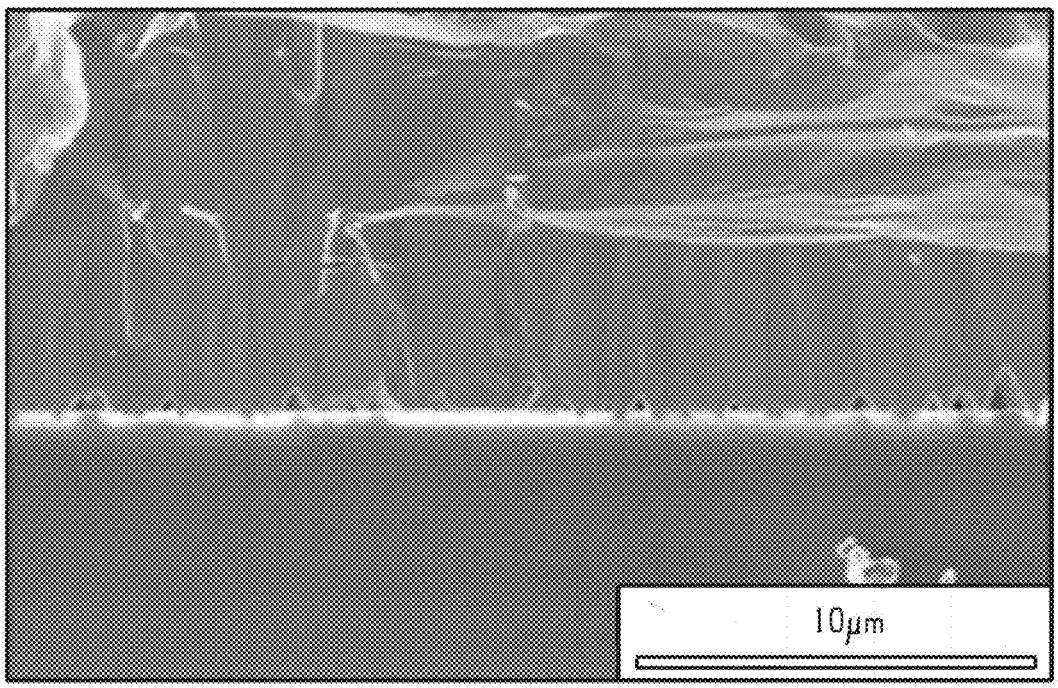
FIG. 6 is a scanning electron microscope (SEM) image of a cross-section of the trace of Example 3.

FIG. 6 is a cross-sectional SEM that was taken of the printed trace from the sample that was heated in a pure $N_2$ ambient to 1,000° C. before $NH_3$ was flowed into the enclosed chamber 2 to induce crystallization. FIG. 6 shows the formation of a 5 to 10 micrometer thick, coalesced GaN film with some roughness growing epitaxially from the sapphire substrate 4. Finally, taking the thickness of the coalesced region and the crystallization time of 5 minutes into account, an estimated growth rate of 1 to 2 micrometers per minute was obtained. This growth rate is comparable to that achievable by MOCVD or hydride vapor phase epitaxy (HVPE), indicating the viability of the GRAM process to create complex structures without sacrificing growth rate over commercially used methods. This growth rate is, however, significantly faster than the highest rate predicted by earlier models, indicating that there may be other factors affecting the growth rate in printed gallium structures. These results demonstrate the potential of the GRAM process for localized printing of single-crystal semiconductor GaN.

Figure 7:
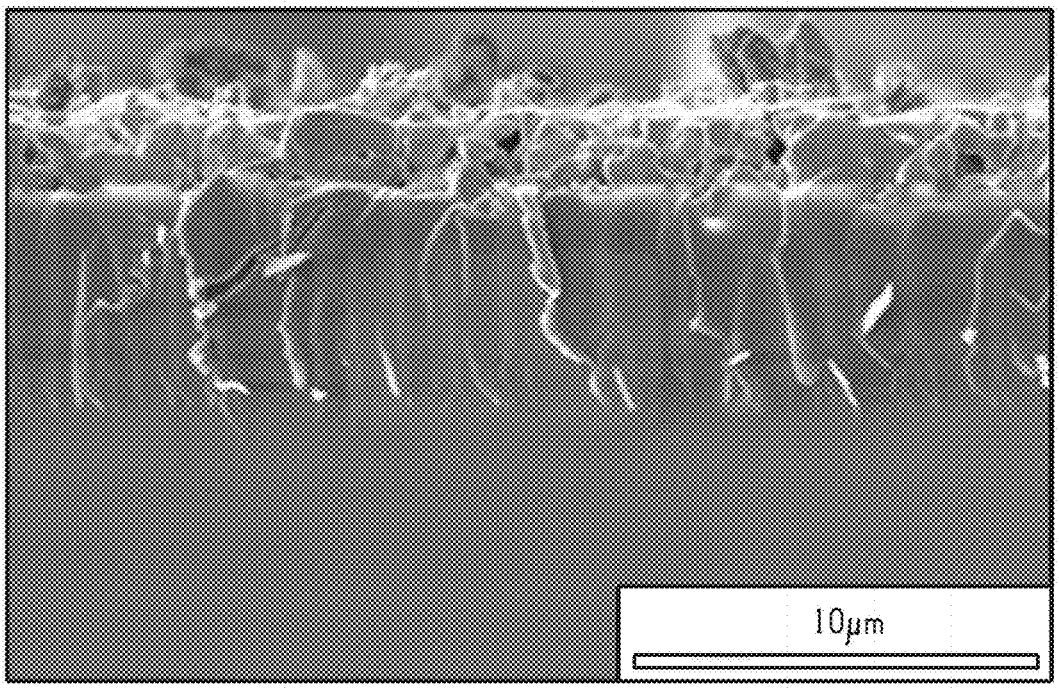
FIG. 7 is an SEM image of a cross-section of an area proximal to the trace of Example 3.

FIG. 7 is a cross-sectional SEM that was taken from an area surrounding the printed trace. FIG. 7 shows that in some regions proximal to the printed trace, rough, uncoalesced, and seemingly polycrystalline GaN islands are formed. Based on the presence of GaN outside the printed line, it is believed that there is some migration of gallium during the crystallization process.

Set forth below are non-limiting aspects of the present disclosure.

Aspect 1: A method for printing a semiconductor material, comprising: depositing a molten metal onto a substrate in an enclosed chamber to form a trace having at least one of a maximum height of 15 micrometers or a maximum width of 25 micrometers to 10 millimeters or a thin film having a maximum height of 15 micrometers; and reacting the molten metal with a gas phase species in the enclosed chamber to form the semiconductor material.

Aspect 2: The method of aspect 1, further comprising translating at least one of an injection orifice in the enclosed chamber or the substrate in an x-y plane during the depositing to form the trace of the molten metal on the substrate.

Aspect 3: The method of any one of the preceding aspects, wherein the molten metal comprises at least one of a molten, Group 13 metal or silicon, and wherein the molten, Group 13 metal comprises at least one of gallium, aluminum, or indium.

Aspect 4: The method of any one of the preceding aspects 1, wherein the gas phase species comprises at least one of a gas phase nitrogen species or a gas phase arsenic species, and wherein the gas phase species further comprises at least one of ammonia ($NH_3$), hydrazine ($N_2H_4$), diimide ($N_2H_2$), or hydrazoic acid ($HN_3$).

Aspect 5: The method of any one of the preceding aspects, wherein the enclosed chamber further comprises an inert gas, and wherein a volume ratio of the inert gas to the gas phase species is 1.25 to 50.

Aspect 6: The method of any one of the preceding aspects, further comprising adding the gas phase species to the enclosed chamber after the depositing.

Aspect 7: The method of any one of the preceding aspects, wherein a temperature of the molten metal during the depositing is greater than or equal to 30° C.

Aspect 8: The method of any one of the preceding aspects, wherein a temperature during the reacting is greater than or equal to 600° C.

Aspect 9: The method of any one of the preceding aspects, wherein the semiconductor material is a single crystal.

Aspect 10: The method of any one of the preceding aspects, wherein the molten metal comprises a p-type dopant.

Aspect 11: The method of any one of the preceding aspects, wherein the molten metal comprises an n-type dopant.

Aspect 12: The method of any one of the preceding aspects, wherein the enclosed chamber further comprises a gas phase, p-type dopant, and wherein the gas phase, p-type dopant permeates the molten metal.

Aspect 13: The method of any one of the preceding aspects, wherein the enclosed chamber further comprises a gas phase, n-type dopant, and wherein the gas phase, n-type dopant permeates the molten metal.

Aspect 14: The method of any one of the preceding aspects, further comprising depositing a second molten metal onto the semiconductor material and allowing the second molten metal to react with the gas phase species in the enclosed chamber to form the semiconductor material having an increased height.

Aspect 15: The method of Aspect 14, wherein at least one of the molten metal or the second molten metal comprises a dopant.

Aspect 16: The method of any one of the preceding aspects, wherein a crystallization rate of the molten metal to form the semiconductor material is 0.035 to 3 micrometers per minute.

Aspect 17: The method of any one of the preceding aspects, wherein the substrate is an atomically symmetric substrate.

Aspect 18: The method of any one of the preceding aspects, wherein the substrate is a sapphire substrate.

Aspect 19: The method of any one of the preceding aspects, wherein the trace or the thin film has a maximum height of 1 to 12 micrometers.

Aspect 20: The method of any one of the preceding aspects, wherein the trace has a maximum width of 100 micrometers to 2 millimeters.

The compositions, methods, and articles can alternatively comprise, consist of, or consist essentially of, any appropriate materials, steps, or components herein disclosed. The compositions, methods, and articles can additionally, or alternatively, be formulated so as to be devoid, or substantially free, of any materials (or species), steps, or components, that are otherwise not necessary to the achievement of the function or objectives of the compositions, methods, and articles.

The terms "a" and "an" do not denote a limitation of quantity, but rather denote the presence of at least one of the referenced item. The term "or" means "and/or" unless clearly indicated otherwise by context. Reference throughout the specification to "an aspect", "an embodiment", "another embodiment", "some embodiments", and so forth, means that a particular element (e.g., feature, structure, step, or characteristic) described in connection with the embodiment is included in at least one embodiment described herein, and may or may not be present in other embodiments. In addition, it is to be understood that the described elements may be combined in any suitable manner in the various embodiments.

When an element such as a layer, film, region, or substrate is referred to as being "on" another element, it can be directly on the other element or intervening elements can also be present. In contrast, when an element is referred to as being "directly on" another element, there are no intervening elements present.

The endpoints of all ranges directed to the same component or property are inclusive of the endpoints, are independently combinable, and include all intermediate points and ranges. For example, ranges of "up to 25° C., or 5 to 20° C." is inclusive of the endpoints and all intermediate values of the ranges of "5 to 25° C.," such as 10 to 23° C., etc.

The term "at least one of" means that the list is inclusive of each element individually, as well as combinations of two or more elements of the list, and combinations of at least one element of the list with like elements not named. Also, the term "combination" is inclusive of blends, mixtures, alloys, reaction products, and the like.

Unless defined otherwise, technical and scientific terms used herein have the same meaning as is commonly understood by one of skill in the art to which this disclosure belongs.

All cited patents, patent applications, and other references are incorporated herein by reference in their entirety. However, if a term in the present application contradicts or conflicts with a term in the incorporated reference, the term from the present application takes precedence over the conflicting term from the incorporated reference.

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

What is claimed is:

1. A method for forming a semiconductor material, comprising:
    depositing a molten metal onto a substrate in an enclosed chamber to form a trace of the molten metal having at least one of a maximum height of 15 micrometers or a maximum width of 25 micrometers to 10 millimeters; wherein the depositing comprises translating at least one of the injection orifice or the substrate in an x-y plane while depositing the molten metal from the injection orifice onto the substrate; or depositing the molten metal onto the substrate in the enclosed chamber to form a thin film of the molten metal having a maximum height of 15 micrometers; and
    reacting the molten metal with a gas phase species in the enclosed chamber to form the semiconductor material;
    wherein a crystallization rate of the molten metal to form the semiconductor material is 0.035 to 3 micrometers per minute.

2. The method of claim 1, comprising the translating to form the trace of the molten metal on the substrate.

3. The method of claim 1, wherein the molten metal comprises at least one of a molten, Group 13 metal or silicon, and wherein the molten, Group 13 metal comprises at least one of gallium, aluminum, or indium.

4. The method of claim 1, wherein the gas phase species comprises at least one of a gas phase nitrogen species or a gas phase arsenic species, and wherein the gas phase species further comprises at least one of ammonia ($NH_3$), hydrazine ($N_2H_4$), diimide ($N_2H_2$), or hydrazoic acid ($HN_3$).

5. The method of claim 1, wherein the enclosed chamber further comprises an inert gas, and wherein a volume ratio of the inert gas to the gas phase species is 1.25 to 50.

6. The method of claim 1, further comprising adding the gas phase species to the enclosed chamber after the depositing.

7. The method of claim 1, wherein a temperature of the molten metal during the depositing is greater than or equal to 30° C.

8. The method of claim 1, wherein a temperature during the reacting is greater than or equal to 600° C.

9. The method of claim 1, wherein the semiconductor material is a single crystal.

10. The method of claim 1, wherein the molten metal comprises a p-type dopant.

11. The method of claim 1, wherein the molten metal comprises an n-type dopant.

12. The method of claim 1, wherein the enclosed chamber further comprises a gas phase, p-type dopant, and wherein the gas phase, p-type dopant permeates the molten metal.

13. The method of claim 1, wherein the enclosed chamber further comprises a gas phase, n-type dopant, and wherein the gas phase, n-type dopant permeates the molten metal.

14. The method of claim 1, wherein the substrate is an atomically symmetric substrate.

15. The method of claim 1, wherein the substrate is a sapphire substrate.

16. The method of claim 1, wherein the trace or the thin film has a maximum height of 1 to 12 micrometers.

17. The method of claim 1, wherein the trace has a maximum width of 100 micrometers to 2 millimeters.

18. A method for forming a semiconductor material, comprising:
- depositing a molten metal onto a substrate in an enclosed chamber to form a trace of the molten metal having at least one of a maximum height of 15 micrometers or a maximum width of 25 micrometers to 10 millimeters; wherein the depositing comprises translating at least one of the injection orifice or the substrate in an x-y plane while depositing the molten metal from the injection orifice onto the substrate; or depositing the molten metal onto the substrate in the enclosed chamber such that is forms a thin film of the molten metal having a maximum height of 15 micrometers; and
- reacting the molten metal with a gas phase species in the enclosed chamber to form the semiconductor material; and
- depositing a second molten metal onto the semiconductor material and allowing the second molten metal to react with the gas phase species in the enclosed chamber to form the semiconductor material having an increased height.

19. The method of claim 18, wherein at least one of the molten metal or the second molten metal comprises a dopant.

20. The method of claim 18, wherein a crystallization rate of the molten metal to form the semiconductor material is 0.035 to 3 micrometers per minute.

* * * * *